United States Patent
Chung et al.

(10) Patent No.: US 6,551,900 B1
(45) Date of Patent: Apr. 22, 2003

(54) TRENCH GATE OXIDE FORMATION METHOD

(76) Inventors: Yifu Chung, No. 19, Li Hsin Rd., Science-Based Industrial Park, Hsinchu (TW); Leon Chang, No. 19, Li Hsin Rd., Science-Based Industrial Park, Hsinchu (TW); Ping-Wei Lin, No. 19, Li Hsin Rd., Science-Based Industrial Park, Hsinchu (TW)

( * ) Notice: Subject to any disclaimer, the term of this patent is extended or adjusted under 35 U.S.C. 154(b) by 0 days.

(21) Appl. No.: 09/547,730

(22) Filed: Apr. 12, 2000

(30) Foreign Application Priority Data

Dec. 9, 1999 (TW) ........................................ 88121607 A

(51) Int. Cl.[7] .............................................. H01L 21/76
(52) U.S. Cl. ...................... 438/424; 438/127; 438/270; 438/248; 438/386; 438/243; 438/138; 257/301; 257/622
(58) Field of Search ................................. 438/197, 424, 438/270, 248, 386, 243, 696, 699; 257/301, 622

(56) References Cited

U.S. PATENT DOCUMENTS

| | | | | |
|---|---|---|---|---|
| 4,894,695 A | * | 1/1990 | Ishii et al. | 257/301 |
| 4,900,692 A | * | 2/1990 | Robinson | 438/421 |
| 4,985,368 A | * | 1/1991 | Ishii et al. | 438/248 |
| 4,992,390 A | * | 2/1991 | Chang | 438/270 |
| 5,098,856 A | * | 3/1992 | Beyer | 438/422 |
| 5,183,775 A | * | 2/1993 | Levy | 438/386 |
| 5,283,201 A | * | 2/1994 | Tsang et al. | 438/138 |
| 5,298,790 A | * | 3/1994 | Harmon et al. | 257/622 |
| 5,911,109 A | * | 6/1999 | Razouk et al. | 438/424 |
| 6,071,794 A | * | 6/2000 | Lin et al. | 438/424 |

\* cited by examiner

*Primary Examiner*—Matthew Smith
*Assistant Examiner*—Belur V Keshavan

(57) ABSTRACT

A method for improving gate oxide thinning issue at trench corners is disclosed. The method comprises steps as follows. Firstly, a silicon substrate having a trench therein is provided. HDPCVD technology to form a first oxide layer on the sidewall and the bottom of the trench is carried out. After performing an etchback to leave the first oxide layer on the bottom of the trench, a second oxide layer is formed on the first oxide layer and on sidewalls of the trench by LPCVD technology. Thereafter, an isotropic etching is performed so as to remove a substantially portion of the second oxide layer and leave a remnant portion of second oxide layer on the trench corners. As a consequently, the trench corners are smooth. Finally, a thermal oxidation to form a third oxide layer on the sidewall of the trench is carried achieved to accomplish the gate oxide formation.

12 Claims, 1 Drawing Sheet

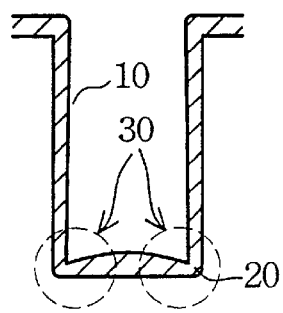
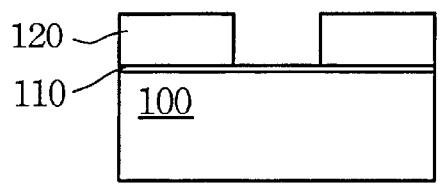
Fig. 1
(Prior Art)
Fig. 2
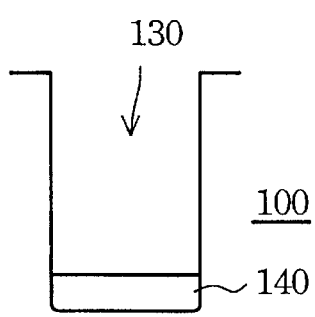
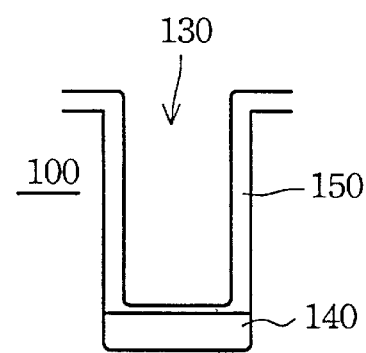
Fig. 3
Fig. 4
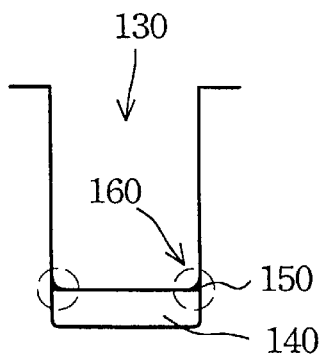
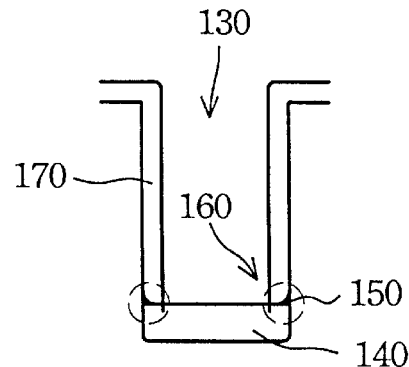
Fig. 5
Fig. 6

TRENCH GATE OXIDE FORMATION METHOD

RELATED APPLICATIONS

This application claims priority from Taiwan Patent Application No. 88121607, filed Dec. 9, 1999, incorporated herein by reference.

1. Field of the Invention

The present invention pertains to a semiconductor device process, and more specifically, to method of improving the gate oxide thinning issue at the trench corner.

2. Background of the Invention

With the advent of the integrated circuit (IC), forming trench structure in the semiconductor structure to increase the integrity has become more and more popular. The trench structure can be applied to a variety of semiconductor processes. For instance, the trench structure can use as trench capacitor to increase the integrity of the IC. Either deep trench or stacked structure can increase the electrode plate area so as to increase the capacitance. Furthermore, the trench isolation technology is widely used to semiconductor device isolation so as to improve the bird beak, which occupies larger planar area. Still, the trench diffused MOS transistor (DMOS) is a MOS transistor formed in the trench for the application to the high power IC.

However, a problem about the gate oxide thinning issue at the trench corners will occur when a thermal oxidation is carried out to form a gate oxide on the sidewall and the bottom of trench. As shown in FIG. 1, the corner denoted by 30 between the sidewall 10 and the bottom 20 shows the thinning gate oxide. As is known skilled in the art, the thinning corner gate oxide will result in leakage current issue. If the problem is not solved, the benefits associated with the recessed channel will be significantly canceled.

SUMMARY OF THE INVENTION

The present invention disclosed a method for improving gate oxide thinning issue at trench corners to prevent leakage current therefrom. The method comprises steps as follows. Firstly, a silicon substrate having a trench therein is provided. A HDPCVD technology to form a first oxide layer on the sidewall and the bottom of the trench is carried out. After performing an etchback to leave the first oxide layer on the bottom of the trench, a second oxide layer is formed on the first oxide layer and on sidewalls of the trench by a LPCVD technology. Thereafter, an isotropic etching is performed so as to remove a substantially portion of the second oxide layer and leave a remnant portion of second oxide layer on the trench corners. Consequently, the trench corners are smooth. Finally, a thermal oxidation to form a third oxide layer on the sidewall of the trench is carried to accomplish the gate oxide formation.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a cross-sectional view of a silicon substrate with a thinning gate oxide at the trench corners according to the prior art.

FIG. 2 is a cross-sectional view of a silicon substrate with silicon nitride hard mask to define a trench according to the present invention.

FIG. 3 is a cross-sectional view of the step of forming a first oxide layer on the sidewall and bottom of the trench by HDPCVD method and then etch back to left first oxide layer on the bottom according to the present invention.

FIG. 4 is a cross-sectional view of forming a second oxide layer on the sidewall and bottom of the trench by LPCVD method according to the present invention;

FIG. 5 is a cross-sectional view of performing an etchback to left portions of the second oxide on the trench corners according to the present invention.

FIG. 6 is a cross-sectional view of forming a gate oxide layer by performing thermal oxidation process according to the present invention.

DETAILED DESCRIPTION OF THE PREFERRED EMBODIMENT

Although the trench structure increases the integrity of the IC while applying in the trench transistor or trench capacitor as is depicted in the forgoing prior art. A thinning gate oxide in the corner of the trench is easily generated as the gate oxide is formed by a thermal process. The thinning gate oxide problem may cause current leakage that requires to be overcome. The present invention is in terms of one HDPCVD (high density plasma CVD) process to deposited an oxide layer incorporated with an etchback process and one LPCVD (low pressure CVD) to form another conformal oxide layer and then perform etchback again before performing the thermal oxidation to solve aforementioned issue.

The detailed processes will be described as follows.

Referring to FIG.2; shows a results of cross-sectional view. A thin pad oxide layer 110 is thermally grown or deposited by CVD method on a <001> orientation silicon substrate 100; thereafter a thick silicon nitride layer 120 deposited by PECVD or LPCVD process is followed. A photoresist pattern (not shown) and an etching process are followed to pattern the silicon nitride layer 120 in a desired position. After stripping the photoresist, an anisotropic etching process using nitride layer as a hard mask is conducted to form a recessed trench region 130 (see FIG. 3) in the silicon substrate 100. Using hot $H_3PO_4$ solution to remove the silicon nitride layer 120 and BOE or diluted HF solution to remove the pad oxide layer 110 are subsequently performed. In a preferred embodiment, the trench 130 has a depth of about 1.8–2.2 μm.

FIG. 2 to FIG. 5 shows the pretreatment processes before performing thermal oxidation to alleviate the thinning oxide of trench corner issue. Please refer to FIG. 3, a first oxide layer is deposited on the sidewalls and the bottom of the trench 130. Preferably, the first oxide layer is about 360 to 440 nm by a high density plasma CVD (HDPCVD) process at a temperature of about 390 to 440° C. Thereafter, an etchback is performed so that there is only bottom of the trench left with the first oxide layer 140. The remaining oxide layer is about 160 to 240 nm in thickness. FIG. 3 shows the results of above processes.

Referring to FIG. 4, a conformal second oxide layer 150 by a low pressure CVD (LPCVD) is formed on the sidewalls and the bottom of the trench 130. In a preferred embodiment, the second oxide layer 150 is deposited at a temperature of about 700 to 740° C. and the thickness of the second oxide layer is about 135–165 nm. Subsequently, an anneal process at a temperature of about 850–950° C. is done. The anneal process is performed to improve the uniform coverage of the second oxide layer 150 and to reduce the etching rate to the second oxide layer 150 so as to increase the process window.

Thereafter, an isotropic etching process such as a wet etching, is performed to etch back a main portion of the second oxide layer 150 and leave a portion of second oxide layer 150 on the corner of the trench 130. Preferably, 0.5% to 1% HF can provide a good process window which is about 30 second. The remnant second oxide layer 150 is about 50–100 nm in thickness. The smooth corners are resulted as denoted by arrow 160.

Finally, referring to FIG. 6, a thermal oxidation is achieved to form a third oxide layer 170 at a temperature of about 840–860° C. The third oxide layer 170 is about 45–55 nm in thickness. There is no thinning corner gate oxide issue to occur.

As is understood by a person skilled in the art, the foregoing preferred embodiment of the present invention is an illustration of the present invention rather than limitation thereon. It is intended to cover various modifications and similar arrangements included within the spirit and scope of the appended claims, the scope of which should be accorded the broadest interpretation so as to encompass all such modifications and similar structure.

What is claimed is:

1. A method for improving thinner gate oxide at trench corners, said method comprising the steps of:

providing a silicon substrate having a trench therein;

forming a first oxide layer on the sidewalls and bottom of said trench;

performing an etchback process to leave said first oxide layer on the bottom of said trench;

performing a LPCVD process to form a second oxide layer on said first oxide layer and the sidewalls of said trench;

performing an anneal process to make uniform said second oxide layer;

performing an isotropic etching to remove a substantially portion of said second oxide layer and to leave a remnant portion of said second oxide layer on said trench corners; and performing a thermal oxidation process to form a third oxide layer on the sidewalls of said trench.

2. The method of claim 1, wherein said first oxide layer is formed by a HDPCVD process to a thickness of about 360–440 nm at a temperature of about 390–410° C.

3. The method of claim 1, wherein the thickness of said first oxide layer is about 160–240 nm in thickness after said etchback process.

4. The method of claim 1, wherein said second oxide is formed at a temperature of about 700–740° C. to about 135–165 nm.

5. The method of claim 1, wherein said step of performing annealing process is done at a temperature of about 850–950° C.

6. The method of claim 1, wherein said isotropic etching is performed by 0.5% to 1% HF as etchant so that only a thickness about 50–100 nm of said second oxide layer is left on said trench corners.

7. The method of claim 1, wherein said third oxide layer is formed at a temperature of about 840–860° C. to a thickness of about 45–55 nm.

8. A method for improving thinner gate oxide at trench corners, said method comprising the steps of:

providing a silicon substrate having a trench therein;

performing a LPCVD process to form a first oxide layer on sidewalls and a bottom of said trench;

performing an etchback process to leave said first oxide layer on the bottom of said trench;

forming a second oxide layer on said first oxide layer and the sidewalls of said trench by a LPCVD process, performing an anneal process to uniform said second oxide layer;

performing an isotropic etching to remove a substantial portion of said second oxide layer and to leave a remnant portion of said second oxide layer on said trench corners; and performing a thermal oxidation process to form a third oxide layer on the sidewall of said trench.

9. The method of claim 8, wherein said first oxide layer is formed at a temperature of about 390–410° C. to a thickness of about 160–240 nm.

10. The method of claim 8, wherein said second oxide layer is formed at a temperature of about 700–740° C. to about 135–165 nm in thickness.

11. The method of claim 8, wherein said third oxide layer is formed at a temperature of about 840–860° C. to a thickness of about 45–55 nm.

12. The method of claim 8, wherein said isotropic etching is performed by 0.5% to 1% HF as etchant so that only a thickness about 50–100 nm of said second oxide layer is left on said trench corners.

* * * * *